United States Patent
Kim

(10) Patent No.: US 7,808,409 B2
(45) Date of Patent: Oct. 5, 2010

(54) MULTI-BIT DATA CONVERTER USING DATA WEIGHT AVERAGING

(75) Inventor: Sang-Ho Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/328,550

(22) Filed: Dec. 4, 2008

(65) Prior Publication Data

US 2009/0085783 A1    Apr. 2, 2009

Related U.S. Application Data

(63) Continuation of application No. 11/844,132, filed on Aug. 23, 2007, now Pat. No. 7,463,175.

(30) Foreign Application Priority Data

Aug. 30, 2006   (KR) .................... 10-2006-0083012

(51) Int. Cl.
*H03M 1/00* (2006.01)
(52) U.S. Cl. ...................... 341/126; 341/144
(58) Field of Classification Search .......... 341/126–155
See application file for complete search history.

(56) References Cited

U.S. PATENT DOCUMENTS

| 5,406,283 | A * | 4/1995 | Leung | 341/143 |
| 6,304,608 | B1 * | 10/2001 | Chen et al. | 341/144 |
| 6,628,258 | B1 * | 9/2003 | Nakamura | 345/98 |
| 7,268,716 | B2 * | 9/2007 | Sakiyama et al. | 341/143 |

* cited by examiner

*Primary Examiner*—Lam T Mai
(74) *Attorney, Agent, or Firm*—F. Chau & Associates, LLC

(57) ABSTRACT

A method for converting data includes matching dynamic elements by repeatedly selecting a portion of unit elements among N unit elements according to data and a circulation direction. An existence of a tone generation possibility is determined by comparing a present pointer position with a previous pointer position and by comparing present data with previous data. At least one of the present pointer position and the circulation direction is changed based on the existence of the tone generation possibility. The present pointer position and the present data are stored or the changed pointer position and the present data are stored. Unit elements are sequentially selected by the present data from the stored pointer position in the circulation direction or the changed circulation direction. The present pointer position is moved by the present data in the circulation direction or the changed circulation direction.

12 Claims, 9 Drawing Sheets

| DATA \ SW | SW0 | SW1 | SW2 | SW3 | SW4 | SW5 | SW6 | SW7 |
|---|---|---|---|---|---|---|---|---|
| XDAC(1)=3 | ▩ | ▩ | ▩ | | | | | |
| XDAC(2)=4 | | | | ▩ | ▩ | ▩ | ▩ | |
| XDAC(3)=1 | | | | | | | | ▩ |
| XDAC(4)=3 | ▩ | ▩ | ▩ | | | | | |
| XDAC(5)=4 | | | | ▩ | ▩ | ▩ | ▩ | |
| XDAC(6)=1 | | | | | | | | ▩ |

MULTI-BIT DATA CONVERTER USING DATA WEIGHT AVERAGING

CROSS-REFERENCE TO RELATED APPLICATION

This application is a continuation of U.S. patent application Ser. No. 11/844,132, filed Aug. 23, 2007 now U.S. Pat. No. 7,463,175, which claims priority under 35 USC §119 to Korean Patent Application No. 10-2006-0083012, filed on Aug. 30, 2006 in the Korean Intellectual Property Office (KIPO), the disclosures of which are hereby incorporated by reference in their entirety.

BACKGROUND OF THE INVENTION

1. Technical Field

The present invention relates to a data converter, and more particularly to a multi-bid data converter using data weight averaging.

2. Discussion of the Related Art

In a mixed-mode signal processing system for processing an analog signal and a digital signal, a data converter is used. The data converter includes an analog-to-digital converter (ADC) and a digital-to-analog converter (DAC). Various data converters having high resolution have been developed.

In both the ADC and the DAC, a sampling technique is used. Among various sampling techniques, Nyquist sampling and oversampling techniques are widely used.

The Nyquist sampling technique uses precise unit elements and is vulnerable to noise and signal interference. Therefore, high resolution is difficult to achieve in a data converter.

A data converter using the oversampling technique samples with much higher (for example, 64 times or 128 times) frequency than the frequency of a signal band. Configuration of the data converter using the oversampling technique is relatively complex and the data converter using the oversampling technique uses an internal circuit having high-speed operation. However, the data converter using the oversampling technique needs comparatively less precise unit elements and is not as vulnerable to noise and signal interference as data converters using the Nyquist sampling technique. Therefore, a higher resolution in the data converter can be achieved using the oversampling technique.

Among several oversampling data converters, a delta-sigma data converter using a delta-sigma modulator may generate high signal-to-noise ratio (SNR) because the delta-sigma data converter performs noise shaping by moving noise energy in a signal band to a high frequency band. Therefore, the delta-sigma data converter is widely used for signal processing in a low frequency and a narrow band such as an audio signal that requires a high resolution and a high SNR.

Among delta-sigma data converters, a delta-sigma data converter using a 1-bit delta signal modulator and an internal 1-bit DAC performs quantization in two steps. Therefore, linearity of the conversion process can be achieved. However, the 1-bit delta signal modulator uses a high-level modulator configuration so as to achieve a high-resolution. The high-level modulator has several problems such as large size, high power consumption and low stability due to generation of an oscillation.

When a multi-bit delta-sigma modulator and an internal multi-bit DAC are used, stability of a whole system can be increased and a high SNR can be achieved with a relatively low oversampling ratio because a low-level delta-sigma modulator is used. However, a data converter using the multi-bit delta-sigma modulator and the internal multi-bit DAC may have noise generated due to mismatched current sources in the internal multi-bit DAC.

FIG. 1 is a block diagram illustrating a general multi-bit DAC.

A 3-bit DAC including eight numbers of current sources is illustrated in FIG. 1. Each of the current sources is designed to generate the same current with respect to one another. However, fluctuations between the respective current sources, that is, a mismatching is caused due to variances of the manufacturing process.

In FIG. 1, current sources having mismatching of −3% through 1% are illustrated.

The multi-bit DAC connects or separates eight switches (that is, unit elements), respectively, based on an input data. When the same data is inputted, the same error is generated because the same switches corresponding to the same input data are connected.

FIG. 2A is a diagram illustrating mismatching linearity noise that is generated when a data weight averaging (DWA) technique is not used in the multi-bit DAC of FIG. 1.

Referring to FIG. 2A, when an input data is 1, only switch $SW_0$ is connected and 1% error is generated. When the input data is 2, switches $SW_0$ and $SW_1$ are connected and 1%+1%, that is, 2% error is generated. When the input data is 3, switches $SW_0$, $SW_1$ and $SW_2$ are connected and 1%+1%+(−3%), that is, −1% error is generated. The same mismatching is generated when the same data is inputted because each current source is predetermined to be selected according to the input data. Therefore, errors according to repeated data are not dispersed to form a low bandwidth, and thus the mismatching error appears within an analog signal band.

A technique for dynamically allocating each of the unit elements has been developed, called dynamic element matching (DEM), to resolve mismatched elements. When unit elements such as current sources are selected randomly, errors are also generated randomly, and thus the noise due to the random errors may be converted to white noise. However, generating a control signal for randomly selecting unit elements uses a relatively complex algorithm and additional corrections. Therefore, methods for spreading the mismatching noise into much wider band than a signal band so as to sufficiently lower a noise floor even though errors are not completely random have been suggested. Among the methods, a DWA method for sequentially selecting unit elements corresponding to a digital input data is widely used.

FIG. 2B is a diagram illustrating mismatching linearity noise that is generated when a DWA technique is used in the multi-bit DAC of FIG. 1.

When input data are 1, 1, and 1, switches $SW_0$, $SW_1$ and $SW_2$ are connected in sequential order and 1%, 1% and −3% errors are generated, respectively. When the input data are 2, 2 and 2, two switches $SW_3$ and $SW_4$, two switches $SW_5$ and $SW_6$ and then two switches $SW_7$ and $SW_0$ are connected in sequential order and 0%, 0%, and 2% errors are generated. When the input data is changed to 3, three switches $SW_1$, $SW_2$ and $SW_3$, three switches $SW_4$, $SW_5$ and $SW_6$, and three switches $SW_7$, $SW_0$ and $SW_1$ are connected in sequential order and −4%, 2% and 3% errors are generated. An error change according to the data is dispersed and noise due to a mismatching is moved to a high band because current sources are sequentially selected. However, when specific data are repeatedly or periodically inputted, use of the conventional DEM generates a tone in the signal band. When the specific data are repeatedly inputted, specific errors are repeatedly generated and the errors cannot be averaged.

FIG. 3 is a diagram illustrating a tone generation when a conventional DWA is adopted. Referring to FIG. 3, specific data '3, 4, 1, 3, 4, 1', is periodically inputted. Then, three unit elements $SW_0$ through $SW_2$, four unit elements $SW_3$ through $SW_6$, and one unit element $SW_7$ are connected in sequential order and mismatching errors are also repeatedly generated. Because noise due to the mismatching errors is generated in a signal band, SNR may be decreased.

In case of a multi-bit DAC having a small bit number such as an audio signal processing system, the possibility of repeated or periodical specific data is high because data types inputted to the multi-bit DAC are simple and the noise due to repeated input data may be in the audible range.

SUMMARY OF THE INVENTION

Some exemplary embodiments of the present invention provide a method of matching dynamic elements using a data weight averaging technique capable of preventing a tone generation.

Some exemplary embodiments of the present invention also provide a data converter including a dynamic elements matching circuit using a data weight averaging technique capable of preventing a tone generation.

In some exemplary embodiments of the present invention, for matching dynamic elements by repeatedly selecting a portion of unit elements among N unit elements according to data and a circulation direction, an existence of a tone generation possibility is determined by comparing a present pointer position with a previous pointer position and by comparing present data with previous data. At least one of the present pointer position and the circulation direction is changed, based on the existence of the tone generation possibility. The present pointer position and the present data are stored when the present pointer position is not changed or the changed pointer position and the present data are stored when the present pointer position is changed. Unit elements are sequentially selected by the present data from the stored pointer position in the circulation direction when the circulation direction is not changed or unit elements are sequentially selected by the present data from the stored pointer position in the changed circulation direction when the circulation direction is changed. The present pointer position is moved by the present data in the circulation direction when the circulation direction is not changed or the present pointer position is moved by the present data in the changed circulation direction when the circulation direction is changed.

The at least one of the present pointer position and the circulation direction may be changed by changing the present pointer position indicating a unit element to a pointer position indicating another unit element and by maintaining the circulation direction.

The at least one of the present pointer position and the circulation direction may be changed by changing the circulation direction to an opposite direction and by maintaining the present pointer position. At least one of the present pointer position and the circulation direction may be changed by changing the present pointer position indicating a unit element to a pointer position indicating another unit element and by changing the circulation direction to an opposite direction.

The existence of the tone generation possibility may be determined by comparing the present pointer position with the previous pointer position, by comparing the present data with the previous data and by generating a data repetition event indicating the tone generation possibility in response to a result of the comparison.

The present pointer position may be compared with the previous pointer position and the present data may be compared with the previous data by comparing a first one of the pointer position and the data whether a present value of the first one is equal to a previous value of the first one and by comparing a second one of the pointer position and the data whether the present value of the second one is equal to the previous value of the second one if the present value of the first one is equal to the previous value of the first one.

The previous pointer position and the previous data may include pointer positions and data stored during a previous one circulation.

The data repetition event may be generated by generating the data repetition event when the present pointer position and the present data are respectively equal to the previous pointer position and the previous data.

The previous pointer position and the previous data may include pointer positions and data stored during two or more previous circulations.

The data repetition event may be generated by generating the data repetition event when two or more present pointer positions are equal to the previous pointer positions and the present data and the previous data corresponding to the two or more present pointer positions are equal.

The data repetition event may be generated by generating the data repetition event when one or more present pointer positions are equal to the previous pointer positions and the present data and the previous data corresponding to the one or more present pointer positions are equal for a predetermined number of times.

The present pointer position may be changed by changing the present pointer position to a pointer position that is shifted by M from the present pointer position in the circulation direction.

The present pointer position may be changed by changing the present pointer position to a pointer position that is shifted by M from the present pointer position in an opposite direction of the circulation direction.

M may correspond to 1.

Unit elements may be sequentially selected by selecting the unit elements in the circulation direction.

Unit elements may be sequentially selected by selecting the unit elements in an opposite direction of the circulation direction.

In exemplary embodiments of the present invention, a data converter includes a multi-bit digital-to-analog converter and a dynamic elements matching circuit. The multi-bit digital-to-analog converter includes N unit elements having mismatching error, drives a portion of unit elements among the N unit elements in response to switching signals and sums the unit signals outputted from the driven unit elements to generate an analog signal corresponding to data. The N numbers of unit elements are designed to output unit signals, and each of the unit signals have a same level. The dynamic elements matching circuit determines an existence of a tone generation possibility by comparing a present pointer position with a previous pointer position and by comparing present data with previous data, changes at least one of the present pointer position and the circulation direction, based on the existence of the tone generation possibility, stores the present pointer position and the present data when the present pointer position is not changed or stores the changed pointer position and the present data when the present pointer position is changed, and generates the switching signals to sequentially select the unit elements by the present data from the stored pointer position in the circulation direction or the changed circulation direction.

The dynamic elements matching circuit may include a switching signal generating unit and a memory. The switching signal generating unit determines the existence of the tone generation possibility by comparing the present pointer position with the previous pointer position and by comparing the present data with the previous data, changes the at least one of the present pointer position and the circulation direction, based on the existence of the tone generation possibility, and generates the switching signals to sequentially select unit elements by the present data from the stored pointer position in the circulation direction or in the changed circulation direction. The memory stores the present pointer position and the present data when the present pointer position is not changed or stores the changed pointer position and the present data when the present pointer position is changed.

The switching signal generating unit may compare a first one of the pointer position and the data whether a present value of the first one is equal to a previous value of the first one and compare a second one of the pointer position and the data whether the present value of the second one if the present value of the first one is equal to the previous value of the first one.

The memory may store pointer positions and data during a previous one circulation.

The switching signal generating unit may determine the data are inputted repeatedly when the present pointer position and the present data are respectively equal to the previous pointer position and the previous data.

The memory may store pointer positions and data during two or more previous circulations.

The switching signal generating unit may determine the data are inputted repeatedly when two or more present pointer positions are equal to the previous pointer positions and the present data and the previous data corresponding to the two or more present pointer positions are equal.

The switching signal generating unit may determine the data are inputted repeatedly when one or more present pointer positions are equal to the previous pointer positions and the present data and the previous data corresponding to the one or more present pointer positions are equal for a predetermined number of times.

The switching signal generating unit may change the present pointer position to a pointer position that is shifted by M from the present pointer position in the circulation direction.

M may correspond to 1.

The switching signal generating unit may change the present pointer position to a pointer position that is shifted by M from the present pointer position in an opposite direction of the circulation direction.

M may correspond to 1.

The switching signal generating unit may generate switching signals for selecting the unit elements in the previous circulation direction.

The switching signal generating unit may generate switching signals for selecting the unit elements in an opposite direction of the circulation direction.

The unit elements may include at least one of a capacitor, a current source, and a resistor array.

Therefore, a method of matching dynamic elements and a data converter according to exemplary embodiments of the present invention may average mismatching errors and decrease a tone generation.

BRIEF DESCRIPTION OF THE DRAWINGS

These and/or other aspects and features of exemplary embodiments of the present invention will become apparent and more readily appreciated from the following description of the exemplary embodiments, taken in conjunction with the accompanying drawings of which.

DETAILED DESCRIPTION OF EXEMPLARY EMBODIMENTS

Figure 1:
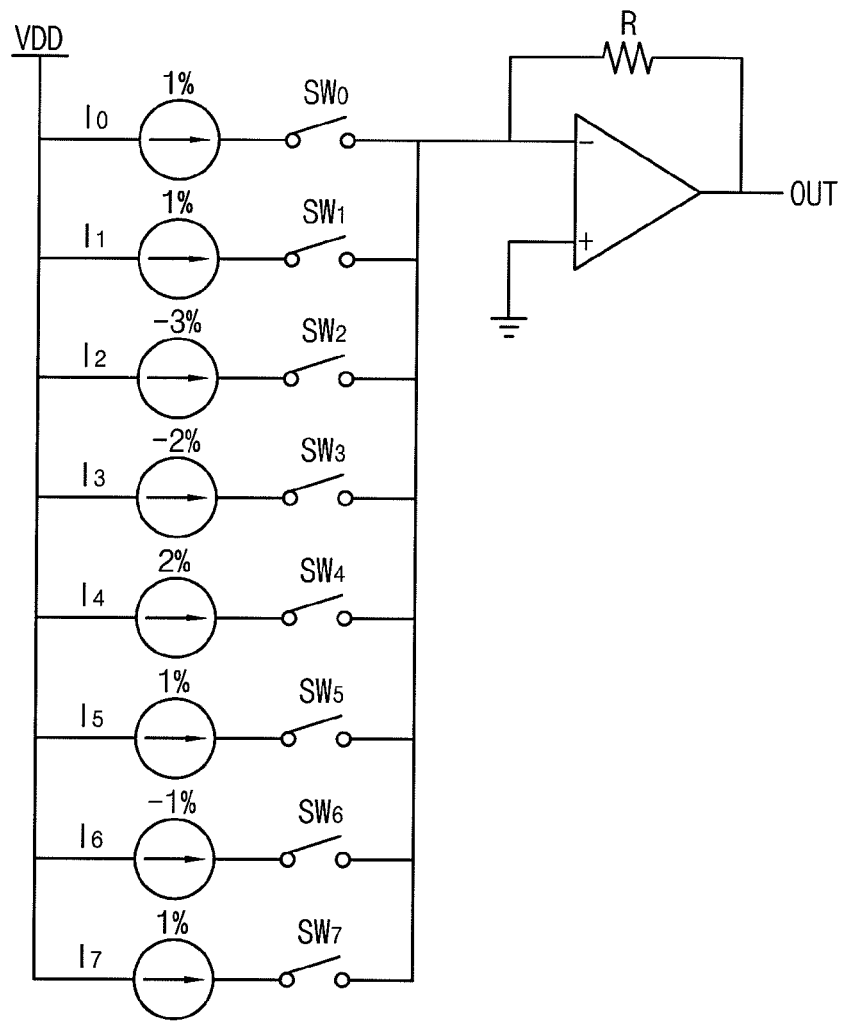
FIG. 1 is a block diagram illustrating a general multi-bit DAC.
Figure 2A:
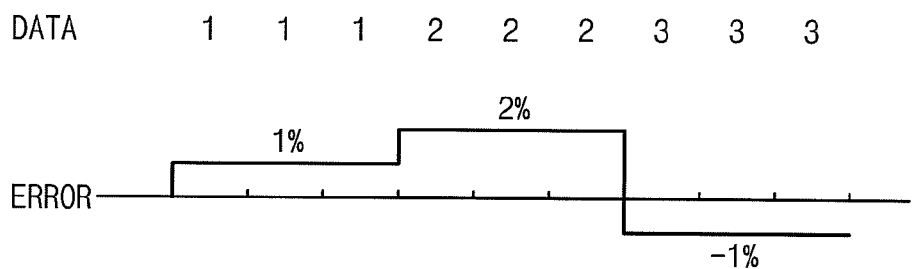
FIG. 2A is a diagram illustrating mismatching linearity noise that is generated when a data weight averaging (DWA) technique is not used in the multi-bit DAC of FIG. 1.
Figures 2B, 3:
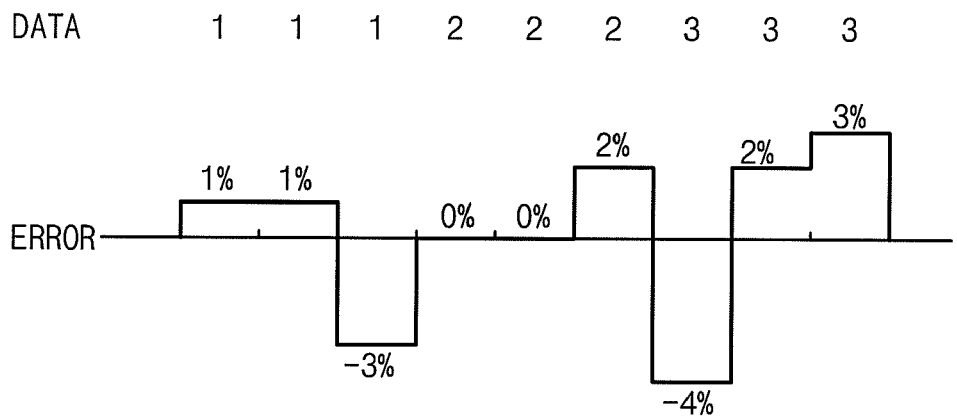
FIG. 2B is a diagram illustrating mismatching linearity noise that is generated when a DWA technique is used in the multi-bit DAC of FIG. 1.
FIG. 3 is a diagram illustrating a tone generation when a conventional DWA is adopted.

Exemplary embodiments of the present invention now will be described more fully with reference to the accompanying drawings, in which exemplary embodiments of the invention are shown. This invention may, however, be embodied in many different forms and should not be construed as limited to the exemplary embodiments set forth herein. Like reference numerals may refer to like elements throughout this application.

Generally, a data weight averaging (DWA) technique uses a pointer position indicating a first unit element among selected unit elements so as to sequentially select the unit elements. A pointer position value is changed by adding a data to a previous pointer position value. When a carry of the pointer position value occurs, the carry is reflected to the added pointer position value and the pointer position value is adjusted into a remainder because the DWA recursively selects unit elements. When the DWA technique is applied to N unit elements, the pointer position value corresponds to an integer between 0 and N−1.

Figure 4:
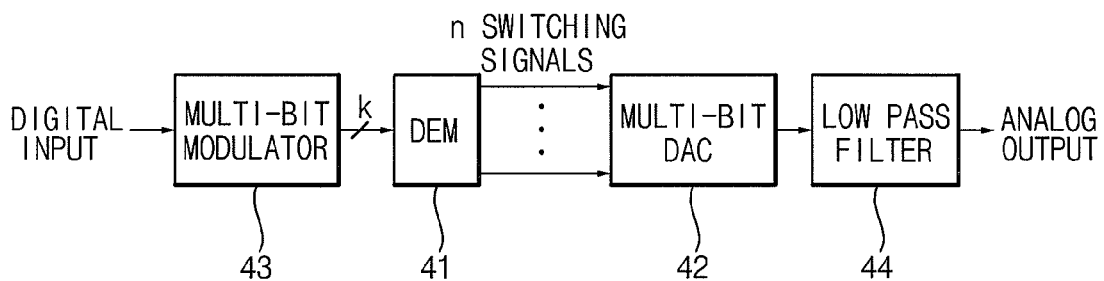
FIG. 4 is a block diagram illustrating a data converter including a dynamic elements matching circuit using a DWA technique according to an exemplary embodiment of the present invention.

In the DWA technique according to an exemplary embodiment of the present invention, unit elements are selected recursively and successively based on an input data. When an event expecting a repetition or periodicity of input data occurs, the DWA technique changes a pointer position to a new pointer position and/or changes a circulation direction to select unit elements based on the changed pointer position and/or the changed circulation direction. FIG. 4 is a block diagram illustrating a data converter including a dynamic elements matching circuit using a DWA technique according to an exemplary embodiment of the present invention.

The data converter includes the dynamic elements matching circuit 41 and a multi-bit digital-to-analog converter (DAC) 42. The data converter may further include a multi-bit modulator 43 that provides k-bit data to the dynamic elements matching circuit 41 and a low pass filter 44 that performs filtering of an analog signal outputted from the multi-bit DAC 42.

The multi-bit DAC 42 includes N (N=$2^k$) numbers of unit elements. Each of the unit elements is designed to output a unit signal (for example, a unit current) of the same size, but a mismatching error may exist between the unit signals respectively outputted from the unit elements.

When data is inputted, a portion of the unit elements is selected by the input data. For example, the unit elements of a number corresponding to the input data are selectively driven in response to switching signals. The analog signal is generated by summing up the unit signals outputted from the driven unit elements.

The dynamic elements matching circuit 41 determines an existence of a tone generation possibility by comparing a present pointer position with a previous pointer position, and by comparing present data with previous data. The dynamic elements matching circuit 41 maintains or changes the present pointer position or the circulation direction in response to a result of the determination, and stores the present pointer position and the data or the changed pointer position and the data. Further, the dynamic elements matching circuit 41 generates the switching signals to sequentially select unit elements of a number corresponding to the input data from the stored pointer position in the circulation direction or the changed circulation direction.

Figure 5:
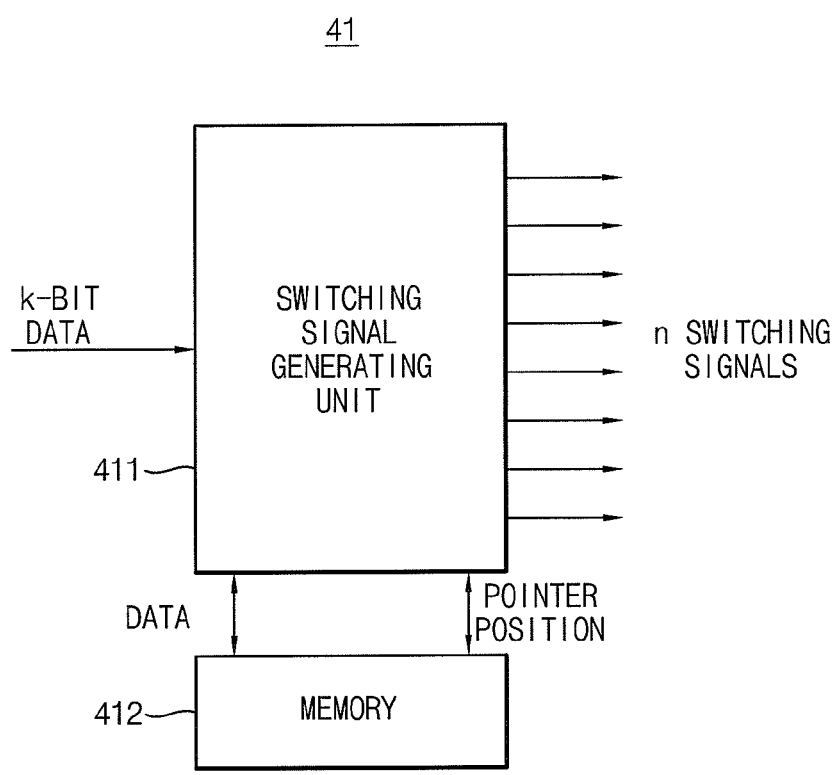
FIG. 5 is a block diagram illustrating a dynamic elements matching circuit using the DWA technique in the data converter of FIG. 4.

FIG. 5 is a block diagram illustrating a dynamic elements matching circuit using the DWA technique in the data converter of FIG. 4.

The dynamic elements matching circuit 41 includes a switching signal generating unit 411 and a memory 412.

The switching signal generating unit 411 receives data and determines whether the data is inputted repeatedly by comparing a present pointer position with a previous pointer position, and by comparing present data with previous data. The switching signal generating unit 411 maintains or changes the present pointer position or the circulation direction in response to a result of the determination, and generates a switching signal to sequentially select unit elements of a number corresponding to a data from the stored pointer position in the circulation direction or the changed circulation direction.

The memory 412 stores the present pointer position and the data when the present pointer position is not changed, or stores the changed pointer position and the data when the present pointer position is changed. Generation of the switching signals by the dynamic elements matching circuit 41 is described later.

Figure 6:
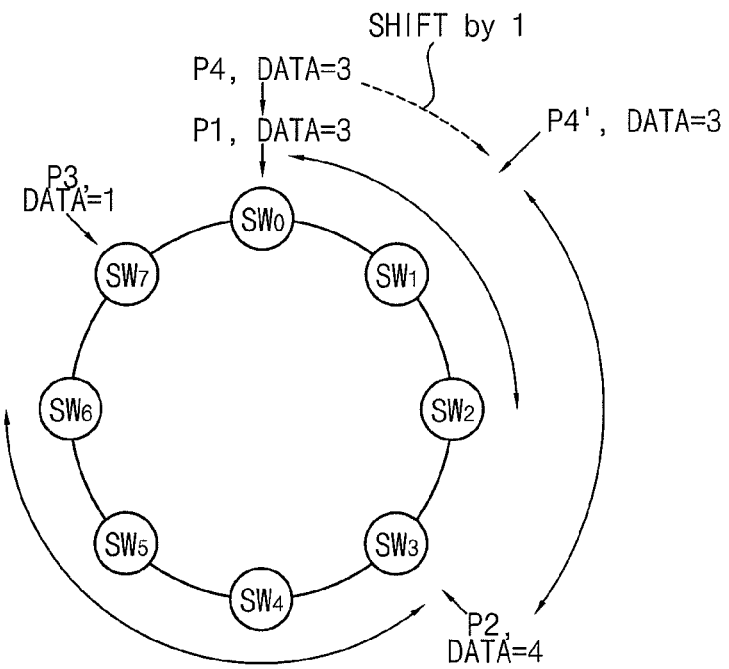
FIG. 6 is a diagram for describing a DWA technique used in a method of matching dynamic elements according to an exemplary embodiment of the present invention.

FIG. 6 is a diagram for describing a DWA technique used in a method of matching dynamic elements according to an exemplary embodiment of the present invention.

FIG. 6 illustrates how unit elements are selected when the total number N of the unit elements is 8 and data '3, 4, 1' are inputted repeatedly or periodically. A pointer position, an input data, and selected unit elements are interrelated. For example, 3@SW0 means data of 3 is inputted when the pointer position indicates unit element $SW_0$, and thus three unit elements, for example, unit elements $SW_0$ through $SW_2$ are selected from unit element $SW_0$ that is indicated by the pointer position. A pointer position value is changed by adding data to the pointer position value. For example, a next pointer position value becomes 3.

If it is assumed that a first pointer position P1 value is 0, and a first data of 3 is inputted (3@SW0), unit elements $SW_0$, through $SW_2$ are selected. A second pointer position P2 value becomes 3 (0+3=3). When a second data of 4 is inputted (4@SW3), unit elements $SW_3$, through $SW_6$ are selected. A third pointer position P3 value becomes 7 (3+4=7). When a third data of 1 is inputted (1@SW7), unit element $SW_7$ is selected. Eight numbers of unit elements are selected recursively. Therefore, the fourth pointer position P4 value becomes 0 (7+1=8*1+0) not 8, because a carry of 1 is generated and a remainder 0 becomes the fourth pointer position value.

When an event expecting data repetition input is generated, a present pointer position value is changed to a value that is added by 1 to the present pointer position value. For example, when a pointer position P4 value is 0 and a fourth data is 3, the event expecting data repetition input may be generated because the pointer position P1 value is 0 and the first data is 3 at previous circulation as illustrated in FIG. 6. Because the pointer position value of 0 and the data of 3 are repeated, the event is generated and the pointer position P4 value is changed to 1 (0+1) immediately. In the circulation, when a carry is generated or a last unit element is selected, one circulation is passed through.

When the fourth data of 3 is inputted (3@SW1), unit elements $SW_1$ through $SW_3$ are selected. The pointer position P4' is changed to 4 (1+3). When a fifth data of 4 is inputted (4@SW4), unit elements $SW_4$ through $SW_7$ are selected. A pointer position value is changed to 0 (4+4=8+0). When a sixth data of 1 is inputted (1@SW0), unit element $SW_0$ is selected and a pointer position value is changed to 1 (0+1).

Figure 7:
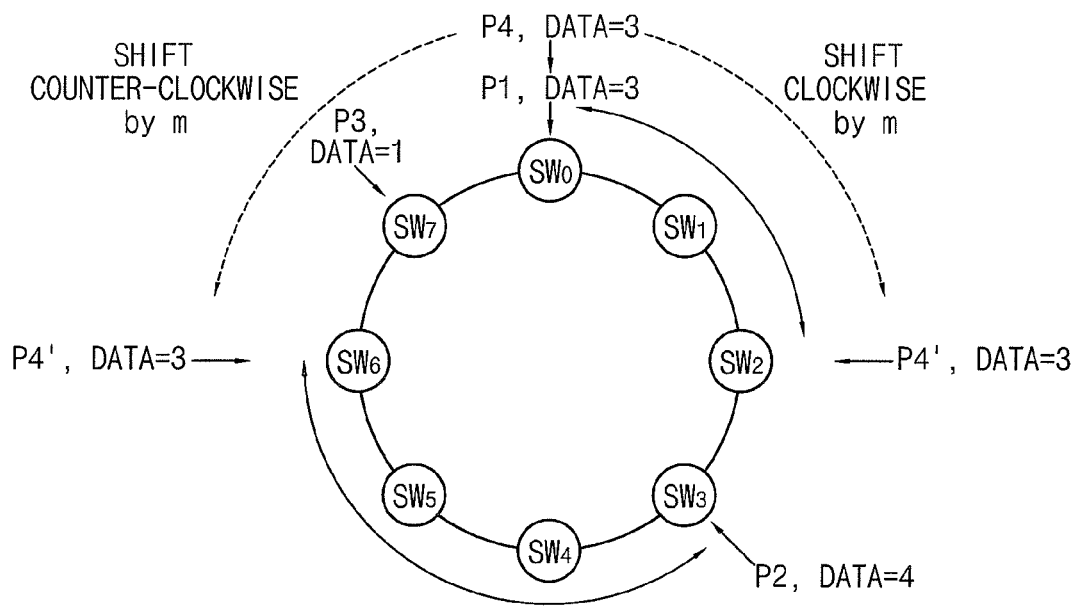
FIG. 7 is a diagram for describing a DWA technique used in a method of matching dynamic elements according to an exemplary embodiment of the present invention.

FIG. 7 is a diagram for describing a DWA technique used in a method of matching dynamic elements according to an exemplary embodiment of the present invention.

It is assumed that N is 8 and data '3, 4, 1' are inputted repeatedly as assumed in FIG. 6.

Referring to FIG. 7, a pointer position is changed according to a predetermined condition and a circulation direction is maintained. For example, when an event expecting a data repetition input is generated, the pointer position value is changed by M from a present pointer position in an ascending order direction (i.e., clockwise direction) or a descending order direction (i.e., counter-clockwise direction). M is greater than or equal to 1 and less than N−1. When the sum of M and a present pointer position value is greater than N, a carry is eliminated and the present pointer position value is changed to a remainder.

Figure 8:
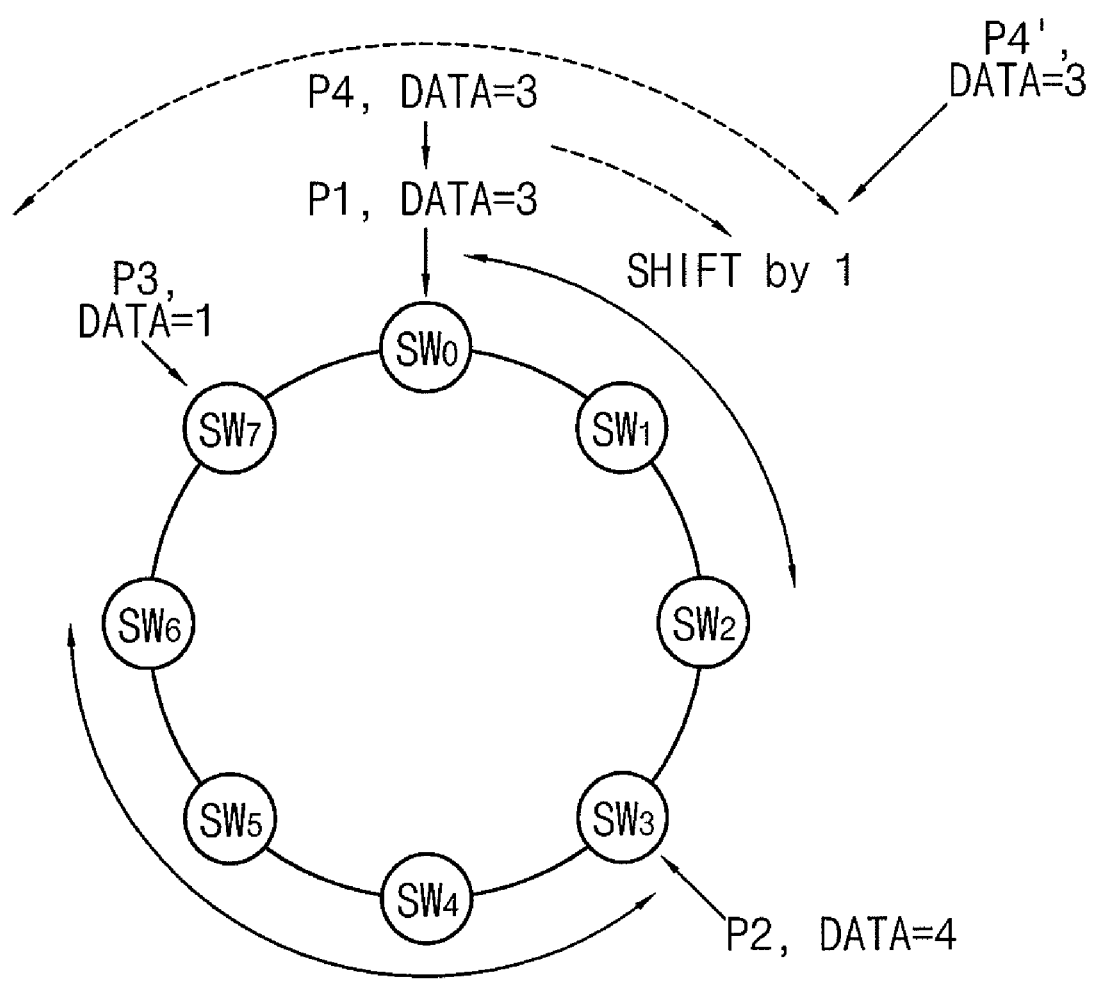
FIG. 8 is a diagram for describing a DWA technique used in a method of matching dynamic elements according to an exemplary embodiment of the present invention.

FIG. 8 is a diagram for describing a DWA technique used in a method of matching dynamic elements according to an exemplary embodiment of the present invention.

It is assumed that N is 8 and data '3, 4, 1' are inputted repeatedly as assumed in FIG. 6 and FIG. 7.

Referring to FIG. 8, a circulation direction is changed when an event expecting a data repetition input is generated. For example, when the event occurs, unit elements are not selected in an ascending order direction as illustrated in FIG. 6, but unit elements are selected in a descending order direction from a changed pointer position in FIG. 8.

The event expecting the data repetition input may be generated according to various conditions.

According to an exemplary embodiment, the event may be generated when present data is equal to previous data of one circulation before with respect to the same pointer position, and present data is equal to previous data of two or more circulations before with respect to the same pointer position.

According to an exemplary embodiment, the event may be generated when two or more present data are equal to two or more previous data with respect to the same two or more pointer positions. For example, the event may be generated when data 2 at pointer position 0 and data 4 at next pointer position 2 are repeated for two circulations.

According to an exemplary embodiment, the event may be generated when the same data at the same pointer position are repeated more than three times. For example, the event may be generated when inputting data 2 at pointer position 0 are successively repeated three times.

Figure 9:
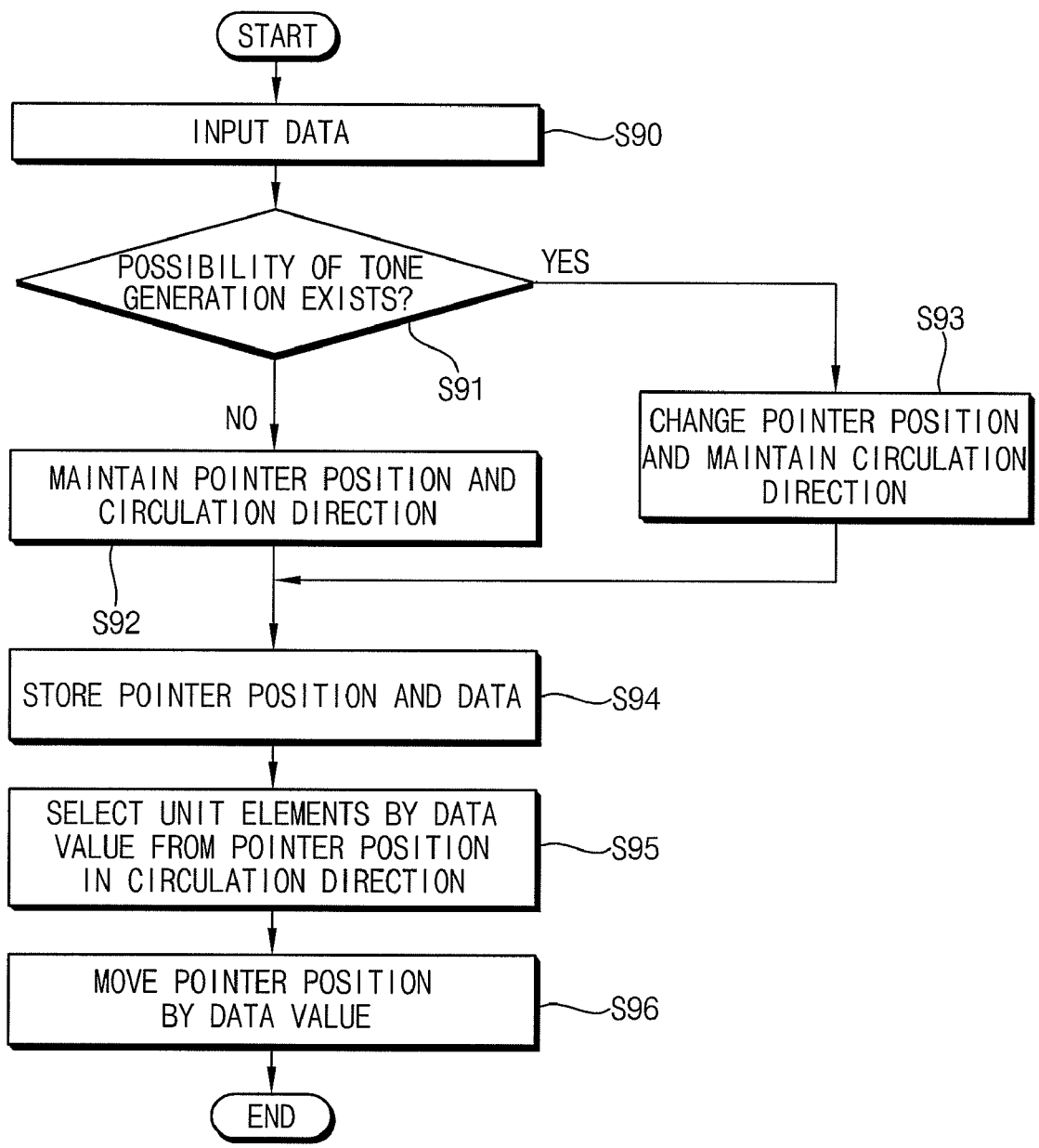
FIG. 9 is a flow chart illustrating a method of matching dynamic elements using a DWA technique according to an exemplary embodiment of the present invention.

FIG. 9 is a flow chart illustrating a method of matching dynamic elements using a DWA technique according to an exemplary embodiment of the present invention.

Referring to FIG. 9, in the method of matching dynamic elements, an improved DWA technique is used to select a portion of unit elements among N unit elements based on a data and a predetermined direction. A position for selecting unit elements, that is, a pointer position is used such that unit elements of a number are selected by a corresponding to data starting from unit element indicated by the pointer position and the pointer position is moved to a next pointer position that is used for next data. When a number of the data is sufficiently large, errors due to mismatching of the unit elements are averaged because the each of the unit elements is selected, and thus a noise due to mismatching error is converted into white noise.

In a method of matching dynamic elements according to an exemplary embodiment of the present invention, when condition for a tone generation is satisfied, a pointer position and/or a circulation direction is changed so that the tone generation may be prevented.

First, data is inputted (step S90), and an existence of a tone generation possibility is determined (step S91). If a present pointer position is compared with a previous pointer position and present data is compared with previous data, an existence of a data repetition input associated with the possibility of the tone generation can be determined.

According to an exemplary embodiment, when data are inputted repeatedly, the possibility of the tone generation exists and thus the data repetition event may be generated. For example, the data repetition event may be generated when a present pointer position is equal to a previous pointer position, and present data corresponding to the present pointer position is equal to previous data corresponding to the previous pointer position. Alternatively, the present data and the previous data may be compared first, and then the corresponding present and previous pointer positions may be compared if the present and previous data are equal.

According to an exemplary embodiment, pointer positions and data of previous one circulation are stored so that the previous pointer positions and the previous data of the previous one circulation may be respectively compared with a present pointer position and present data. According to another exemplary embodiment, pointer positions and data of previous two or more circulations are stored so that the pointer positions and the data of the previous two or more circulations may be respectively compared with the present pointer position and the present data. For example, the data repetition event may be generated when a present pointer position and present data are respectively equal to a previous pointer position and previous data on one occasion, or the data repetition event may be generated when a present pointer position and present data are respectively equal to a previous pointer position and previous data two or more times.

When the tone generation possibility does not exist (step S91: NO), the present pointer position and a present circulation direction are maintained (step S92). The circulation direction may be an ascending order direction (clockwise direction in FIG. 6) or a descending order direction (counterclockwise direction in FIG. 6). However, when the tone generation possibility exists (step S91: YES), the present pointer position is changed (step S93). For example, when a present pointer indicates a first unit element and the tone generation possibility exists, the present pointer may be changed to a pointer position indicating a second unit element, a third unit element, etc.

According to an exemplary embodiment, the present pointer position indicating a present unit element may be changed to a pointer position indicating a unit element that is away by a shift number M from the present unit element. The shift number M may be fixed or varied according to time elapse.

The changed pointer position and the data are stored when the present pointer position is changed, and the present pointer position and the data are stored when the present pointer position is not changed (step S94). The pointer position is stored after being changed because next pointer position and next data are respectively compared with the changed pointer position and the data.

When the present pointer position is changed, unit elements of a number corresponding to the data are selected from the changed pointer position in the circulation direction, and when the present pointer position is not changed, unit elements are selected by the data from the present pointer position in the circulation direction (step S95).

After the unit elements are selected, the pointer position is moved by the data value in the circulation direction (step S96). A new data is inputted at the moved pointer position and the steps described above are performed repeatedly.

Figure 10:
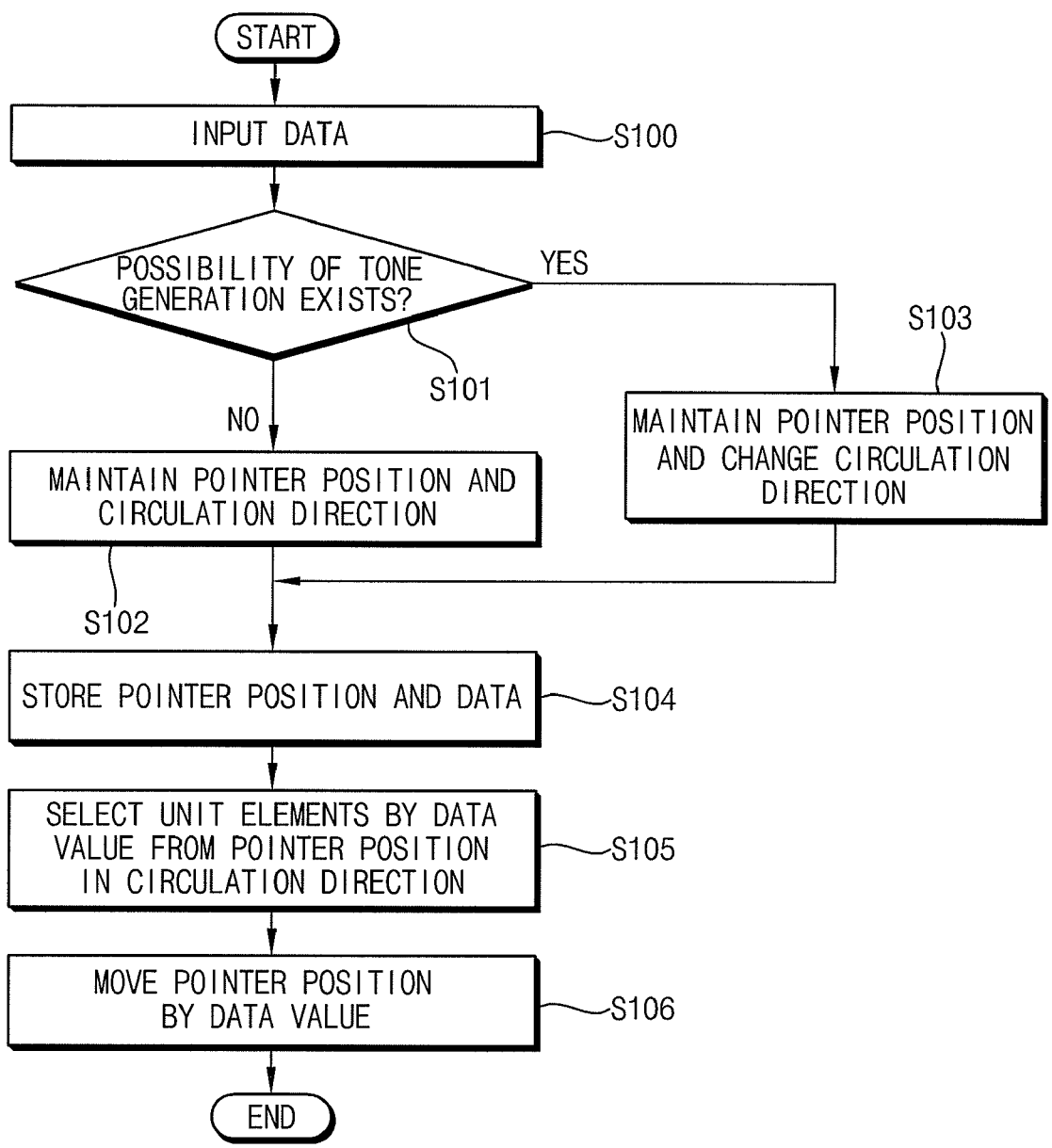
FIG. 10 is a flow chart illustrating a method of matching dynamic elements using a DWA technique according to an exemplary embodiment of the present invention.

FIG. 10 is a flow chart illustrating a method of matching dynamic elements using a DWA technique according to an exemplary embodiment of the present invention.

Referring to FIG. 10, a data is inputted (step S100), and an existence of a tone generation possibility is determined (step S101). If a present pointer position is compared with a previous pointer position and present data is compared with previous data, an existence of a data repetition input associated with the possibility of the tone generation can be determined.

According to an exemplary embodiment, when data are inputted repeatedly, the tone generation possibility exists and thus the data repetition event may be generated. For example, the data repetition event is generated when a present pointer position is equal to a previous pointer position and present data corresponding to the present pointer position is equal to previous data corresponding to the previous pointer position. Alternatively, the present data and the previous data may be compared first, and then the corresponding present and previous pointer positions may be compared if the present and previous data are equal.

According to an exemplary embodiment, pointer positions and data of previous one circulation may be stored so that the previous pointer positions and the previous data of the previous one circulation may be respectively compared with a present pointer position and present data. According to another exemplary embodiment, pointer positions and data of previous two or more circulations may be stored so that the pointer positions and the data of the previous two or more circulations may be respectively compared with the present pointer position and the present data.

For example, the data repetition event may be generated when a present pointer position and present data are respectively equal to a previous pointer position and previous data on one occasion, or the data repetition event may be generated when a present pointer position and present data are respectively equal to a previous pointer position and previous data two or more times.

When the tone generation possibility does not exist (step S101: NO), the present pointer position and a circulation direction are maintained (step S102). However, when the tone generation possibility exists (step S101: YES), the circulation direction is changed (step S103). For example, when the circulation direction is an ascending order direction, the circulation direction may be changed to a descending order direction. When the circulation direction is changed, the changed circulation direction is maintained until the changed circulation is changed again.

The present pointer position and the data are stored (step S104) without changing the present point.

Unit elements of a number corresponding to the data are selected from the present pointer position in the changed circulation direction when the circulation direction is changed, and unit elements are selected by the data value from the present pointer position in the circulation direction when the circulation direction is not changed (step S105).

After the unit elements are selected, the present pointer position is moved by the data value in the circulation direction (step S1106).

A new data is inputted at the moved pointer position and the steps described above are performed repeatedly.

Figure 11:
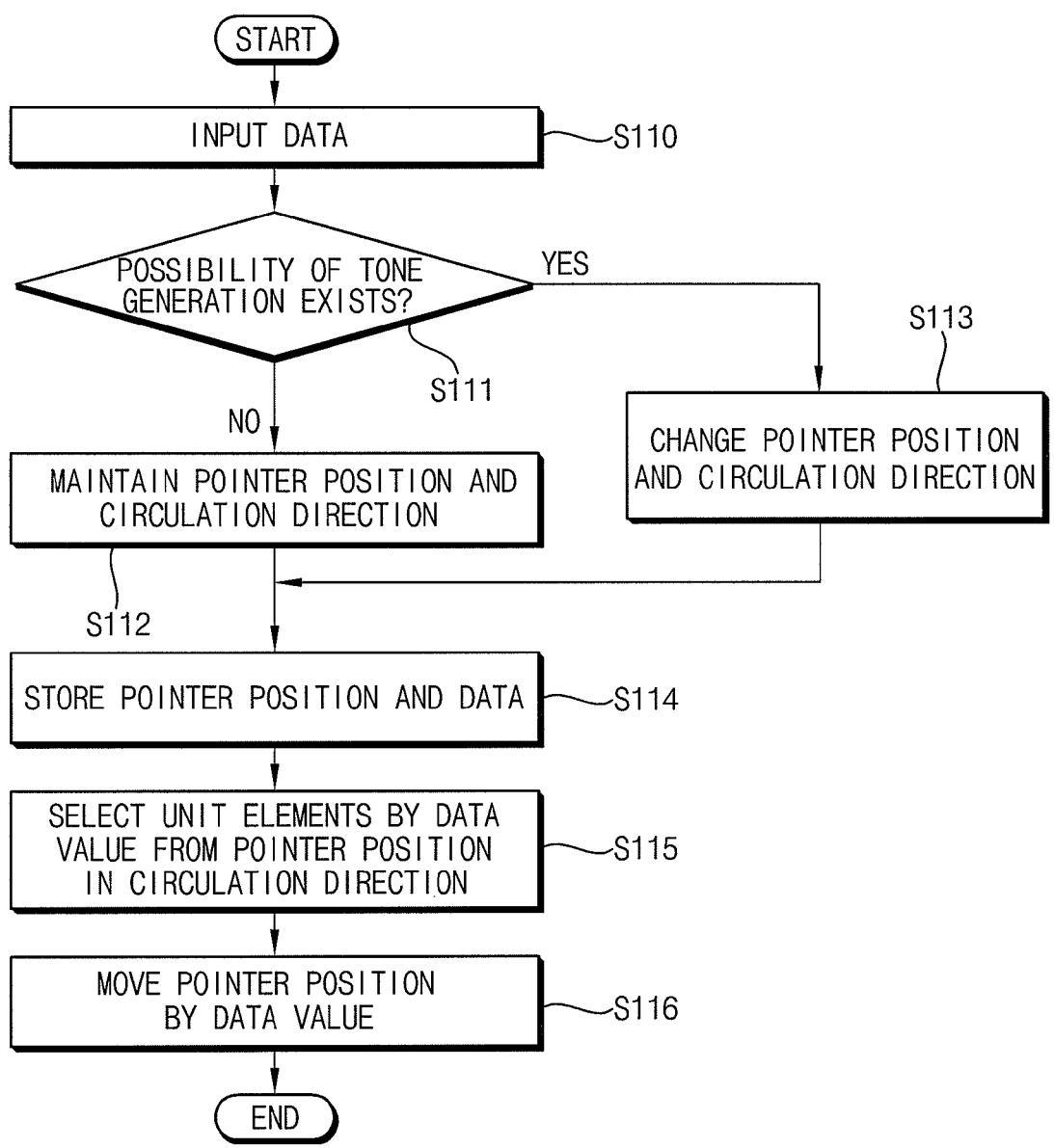
FIG. 11 is a flow chart illustrating a method of matching dynamic elements using a DWA technique according to an exemplary embodiment of the present invention.

FIG. 11 is a flow chart illustrating a method of matching dynamic elements using a DWA technique according to an exemplary embodiment of the present invention.

Referring to FIG. 11, a data is inputted (step S110), and an existence of a tone generation possibility is determined (step S111). If a present pointer position is compared with a previous pointer position and present data is compared with previous data, an existence of a data repetition input can be determined and thus the tone generation possibility is determined.

According to an exemplary embodiment, when data are inputted repeatedly, the tone generation possibility exists and thus the data repetition event may be generated. For example, the data repetition event is generated when a present pointer position is equal to a previous pointer position and present data corresponding to the present pointer position is equal to previous data corresponding to the previous pointer position. Alternatively, the present data and the previous data may be compared first, and then the corresponding present and previous pointer positions may be compared if the present and previous data are equal.

According to an exemplary embodiment, pointer positions and data of a previous one circulation may be stored so that the previous pointer positions and the previous data of the previous one circulation may be respectively compared with a present pointer position and present data. According to an exemplary embodiment, pointer positions and data of previous two or more circulations may be stored so that the pointer positions and the data of the previous two or more circulations may be respectively compared with the present pointer position and the present data.

For example, the data repetition event may be generated when a present pointer position and present data are respectively equal to a previous pointer position and previous data on one occasion, or the data repetition event may be generated when a present pointer position and present data are respectively equal to a previous pointer position and previous data two or more times.

When the tone generation possibility does not exist (step S111: NO), the present pointer position and a circulation direction are maintained (step S112). However, when the tone generation possibility exists (step S111: YES), both of the present pointer position and the circulation direction are changed (step S113).

According to an exemplary embodiment, the present pointer position indicating a present unit element may be changed to a pointer position indicating a unit element that is away by a shift number M from the present unit element. Also, the circulation direction is changed to an opposite direction of the circulation direction. For example, when the circulation direction is an ascending order direction and the data repetition event is generated, the present pointer position may be changed by the shift number M in a descending order direction.

According to an exemplary embodiment, the shift number M may be fixed or varied according to time elapse.

The changed pointer position and the data are stored when the present pointer position is changed and the present pointer position and the data are stored when the present pointer position is not changed (step S114). The pointer position is stored after being changed because next pointer position and next data are respectively compared with the changed pointer position and the data.

When the present pointer position and the circulation direction are changed, unit elements of a number corresponding to the data are selected from the changed pointer position in the changed circulation direction, and when the present pointer position and the circulation direction are not changed, unit elements are selected by the data value from the present pointer position in the circulation direction (step S115).

After the unit elements are selected, the present pointer position is moved by the data value in the circulation direction (step S116). A new data is inputted at the moved pointer position and the steps described above are performed repeatedly.

Figure 12:
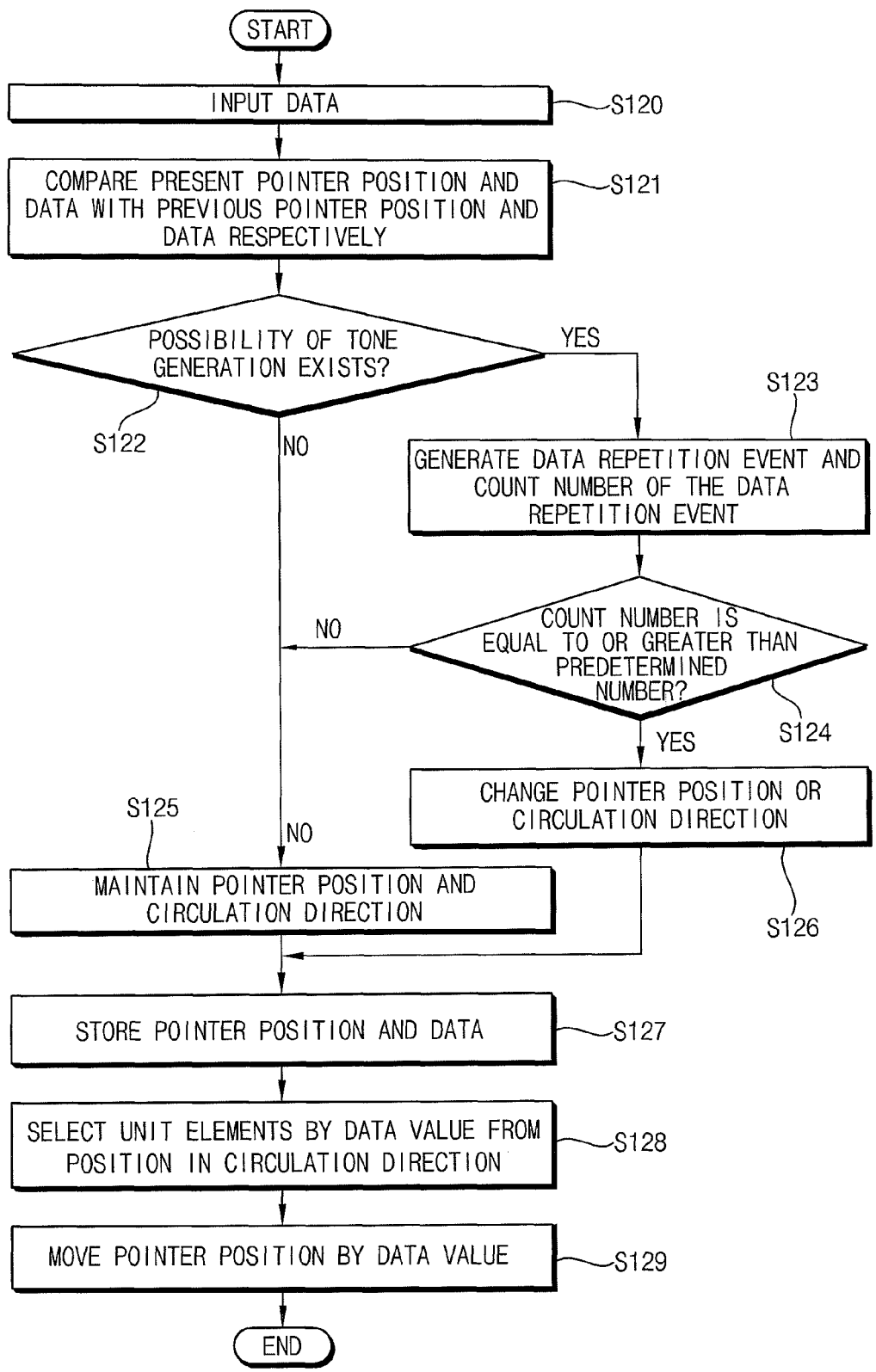
FIG. 12 is a flow chart illustrating a method of matching dynamic elements using a DWA technique according to an exemplary embodiment of the present invention.

FIG. 12 is a flow chart illustrating a method of matching dynamic elements using a DWA technique according to an exemplary embodiment of the present invention.

In the DWA technique of FIG. 12, condition of possibility of a tone generation is relatively rigorous compared with the DWA techniques of FIGS. 9, 10 and 11.

Referring to FIG. 12, a data is inputted (step S120) and a present pointer position is compared with a previous pointer position and present data is compared with previous data (step S121). An existence of a tone generation possibility is determined (step S122) based on the comparison result. When the same data are inputted at the same pointer position, a data repetition event is generated and a number of the data repetition event is counted (step S123). For example, the data repetition event is generated when a present pointer position is equal to a previous pointer position and present data corresponding to the present pointer position is equal to previous data corresponding to the previous pointer position. Alternatively, the present data and the previous data may be compared first, and then the corresponding present and previous pointer positions may be compared if the present and previous data are equal.

According to an exemplary embodiment, pointer positions and data of a previous one circulation may be stored so that the previous pointer positions and the previous data of the previous one circulation may be respectively compared with a present pointer position and present data. According to an exemplary embodiment, pointer positions and data of previous two or more circulations may be stored so that the pointer positions and the data of the previous two or more circulations may be respectively compared with the present pointer position and the present data.

For example, the data repetition event may be generated when a present pointer position and present data are respectively equal to a previous pointer position and previous data on one occasion, or the data repetition event may be generated when a present pointer position and present data are respectively equal to a previous pointer position and previous data two or more times.

It is determined whether the count number is equal to or greater than a predetermined number (step S124). When the number of the data repetition event is less than the predetermined number (step S124: NO) or the data repetition event is not generated (step S122: NO), the present pointer position and a circulation direction are maintained (step S125) because the tone generation possibility does not exist. However, when the number of the data repetition event is equal to or greater than the predetermined number (step S124: YES), the present pointer position or the circulation direction is changed (step S126) because the tone generation possibility exists.

According to an exemplary embodiment, the present pointer position indicating a present unit element may be changed to a pointer position indicating a unit element that is away by a shift number M from the present unit element. Also, the circulation direction is changed to an opposite direction of the circulation direction. For example, when the circulation direction is an ascending order direction and the number of the data repetition event is equal to or greater than the predetermined number, the present pointer position may be moved by the shift number M in a descending order direction.

According to an exemplary embodiment, the shift number M may be fixed or varied according to time elapse.

The changed pointer position and the data are stored when the present pointer position is changed, and the present pointer position and the data are stored when the present pointer position is not changed (step S127). The pointer position is stored after being changed because next pointer position and next data are respectively compared with the changed pointer position and the data.

When the present pointer position and the circulation direction are changed, unit elements of a number corresponding to the data are selected from the changed pointer position in the changed circulation direction, and when the present pointer position and the circulation direction are not changed, unit elements are selected by the data value from the present pointer position in the circulation direction (step S128).

After the unit elements are selected, the present pointer position is moved by the data value in the circulation direction (step S129). A new data is inputted at the moved pointer position and the steps described above are performed repeatedly.

A method of matching dynamic elements and a data converter according to exemplary embodiments of the present invention may average mismatching errors and decrease a tone generation without including a random circuit that has a complex configuration and high power consumption.

While the present invention has been particularly shown and described with reference to exemplary embodiments thereof, it will be understood by those of ordinary skill in the art that various changes in form and details may be made without departing from the spirit and scope of the present invention.

What is claimed is:

1. A method of converting data wherein dynamic elements are matched by repeatedly selecting a portion of unit elements among N unit elements according to data and a circulation direction, wherein N is a positive integer, the method comprising:
   determining an existence of a tone by comparing a present pointer position with a previous pointer position and by comparing present data with previous data, the previous pointer position being one of pointer positions stored during a previous one or more circulation, the previous data being one of data stored during the previous one or more circulation;
   changing at least one of the present pointer position and the circulation direction, based on the existence of the tone;
   storing the present pointer position and the present data when the present pointer position is not changed and storing the changed pointer position and the present data when the present pointer position is changed;
   sequentially selecting unit elements by the present data from the stored pointer position in the circulation direction when the circulation direction is not changed and sequentially selecting unit elements by the present data from the stored pointer position in the changed circulation direction when the circulation direction is changed; and
   moving the present pointer position by the present data in the circulation direction when the circulation direction is not changed and moving the present pointer position by the present data in the changed circulation direction when the circulation direction is changed.

2. The method of claim 1, wherein changing the at least one of the present pointer position and the circulation direction includes changing the present pointer position to another pointer position with respect to which data equal to the present data is not stored during the previous one or more circulation.

3. The method of claim 2, wherein changing the present pointer position to the another pointer position includes changing the present pointer position to an initial pointer position when the data equal to the present data is stored with respect to all pointer positions during the previous one or more circulation.

4. The method of claim 1, further comprising:
   positioning the present pointer position interrelated with the present data to a pointer position with respect to which data equal to the present data is not stored during the previous one or more circulation when the present data is inputted.

5. The method of claim 4, wherein positioning the present pointer position to the pointer position includes positioning the present pointer position to an initial pointer position when the data equal to the present data is stored with respect to all pointer positions during the previous one or more circulation.

6. A data converter comprising:

a multi-bit digital-to-analog converter including N unit elements having mismatching error, configured to drive a portion of unit elements among the N unit elements in response to switching signals, and configured to sum the unit signals outputted from the driven unit elements to generate an analog signal corresponding to data, the N unit elements designed to output unit signals, each of the unit signals having a same level, wherein N is a positive integers; and a dynamic elements matching circuit configured to: determine an existence of a tone by comparing a present pointer position with a previous pointer position and by comparing present data with previous data, change at least one of the present pointer position and the circulation direction, based on the existence of the tone, store the present pointer position and the present data when the present pointer position is not changed and store the changed pointer position and the present data when the present pointer position is changed, and generate the switching signals to sequentially select the unit elements by the present data from the stored pointer position in the circulation direction or the changed circulation direction, wherein the previous pointer position is one of pointer positions stored during the previous one or more circulation and the previous data is one of data stored during the previous one or more circulation.

7. The data converter of claim 6, wherein the dynamic elements matching circuit comprises:

a switching signal generating unit configured to: determine the existence of the tone by comparing the present pointer position with the previous pointer position and by comparing the present data with the previous data, change the at least one of the present pointer position and the circulation direction, based on the existence of the tone, and generate the switching signals to sequentially select unit elements by the present data from the stored pointer position in the circulation direction or the changed circulation direction;

a memory configured to store the present pointer position and the present data when the present pointer position is not changed and store the changed pointer position and the present data when the present pointer position is changed.

8. The data converter of claim 7, wherein the memory accumulates the present pointer position and the present data as the previous pointer position and the previous data for a next data input.

9. The data converter of claim 7, wherein the switching signal generating unit changes the present pointer position to another pointer position with respect to which data equal to the present data is not stored during the previous one or more circulation when the switching signal generating unit changes the present pointer position based on the existence of the tone.

10. The data converter of claim 9, wherein the switching signal generating unit changes the present pointer position to an initial pointer position when the data equal to the present data is stored with respect to all pointer positions during the previous one or more circulation.

11. The data converter of claim 7, wherein the switching signal generating unit positions the present pointer position interrelated with present data to a pointer position with respect to which data equal to the present data is not stored during the previous one or more circulation when the present data is inputted.

12. The data converter of claim 11, wherein the switching signal generating unit positions the present pointer position to an initial pointer position when the data equal to the present data is stored with respect to all pointer positions during the previous one or more circulation.

* * * * *